United States Patent
Aoyama et al.

(10) Patent No.: US 10,180,293 B2
(45) Date of Patent: Jan. 15, 2019

(54) HEAT RADIATING PLATE AND METHOD FOR PRODUCING SAME

(71) Applicant: DOWA METALTECH CO., LTD., Tokyo (JP)

(72) Inventors: Tomotsugu Aoyama, Tokyo (JP); Akira Sugawara, Tokyo (JP)

(73) Assignee: DOWA METALTECH CO., LTD., Tokyo (JP)

( * ) Notice: Subject to any disclaimer, the term of this patent is extended or adjusted under 35 U.S.C. 154(b) by 66 days.

(21) Appl. No.: 15/278,340

(22) Filed: Sep. 28, 2016

(65) Prior Publication Data
US 2017/0122681 A1 May 4, 2017

(30) Foreign Application Priority Data
Nov. 2, 2015 (JP) .................... 2015-215951

(51) Int. Cl.
| | |
|---|---|
| *B21B 3/00* | (2006.01) |
| *C22C 9/02* | (2006.01) |
| *C22F 1/08* | (2006.01) |
| *F28F 21/08* | (2006.01) |
| *H01L 21/48* | (2006.01) |
| *H01L 23/367* | (2006.01) |
| *H01L 23/373* | (2006.01) |

(52) U.S. Cl.
CPC .............. *F28F 21/085* (2013.01); *B21B 3/00* (2013.01); *C22C 9/02* (2013.01); *C22F 1/08* (2013.01); *H01L 21/4878* (2013.01); *H01L 23/367* (2013.01); *H01L 23/3736* (2013.01); *B21B 2003/005* (2013.01); *B21B 2261/22* (2013.01)

(58) Field of Classification Search
CPC .. F28F 21/085; F28F 3/02; F28F 13/00; F28F 23/00; F24F 2221/34; F24F 6/025; B21B 3/00; B21B 2003/005; B21B 2261/22; C22C 9/02; C22F 1/08; H01L 21/4878; H01L 23/367; H01L 23/3736; H01L 23/3672; H01L 23/46
USPC ................................................... 165/185, 64
See application file for complete search history.

(56) References Cited

U.S. PATENT DOCUMENTS

| | | | | |
|---|---|---|---|---|
| 4,869,758 A | * | 9/1989 | Watanabe | ................. C22C 9/00 148/326 |
| 6,132,529 A | * | 10/2000 | Hatakeyama | ............. C22C 9/00 148/433 |
| 2003/0099853 A1 | * | 5/2003 | Takayama | ................. C22C 9/02 428/553 |
| 2003/0155051 A1 | * | 8/2003 | Mino | ........................ C22C 9/00 148/554 |

(Continued)

FOREIGN PATENT DOCUMENTS

| | | |
|---|---|---|
| JP | 2007088045 | 4/2007 |
| JP | 2007220702 | 8/2007 |

*Primary Examiner* — Justin M Jonaitis
(74) *Attorney, Agent, or Firm* — Bachman & LaPointe, PC (57) ABSTRACT

A method for producing a heat radiating plate, the method containing the steps of: finish cold-rolling an annealed material to obtain a strip; causing the strip to wind in the shape of a coil to prepare a coil stock; unwinding the coil stock by means of an uncoiler to obtain a strip; causing the strip to pass through a gap between the rolls of a leveler to correct the shape thereof; progressively feeding the corrected strip to a progressive die via a feeder to progressively press-working the strip to produce a heat radiating plate.

5 Claims, 3 Drawing Sheets

(56) References Cited

U.S. PATENT DOCUMENTS

| | | | | |
|---|---|---|---|---|
| 2009/0053090 A1* | 2/2009 | Terao | ................... | C22C 1/04 |
| | | | | 419/29 |
| 2009/0116996 A1* | 5/2009 | Aruga | ................... | C22C 9/02 |
| | | | | 420/472 |
| 2010/0269959 A1* | 10/2010 | Gao | ................... | C22C 9/00 |
| | | | | 148/554 |

\* cited by examiner

HEAT RADIATING PLATE AND METHOD FOR PRODUCING SAME

BACKGROUND OF THE INVENTION

Field of the Invention

The present invention generally relates to a heat radiating plate and a method for producing the same. More specifically, the invention relates to a heat radiating plate for an electronic part mounting substrate, and a method for producing the same.

Description of the Prior Art

Heat radiating plates for electronic part mounting substrates are required to have good thermal conductivity since they are required to efficiently radiate heat generated from electronic parts, such as semiconductor elements.

As such a heat radiating plate, there is widely used a heat radiating plate of copper or a copper alloy having good thermal conductivity. Such a heat radiating plate is generally produced by press-forming a strip of copper or a copper alloy by means of a progressive die, and then, by carrying out a treatment, such as nickel plating, if necessary (see, e.g., Japanese Patent Laid-Open No. 2007-220702).

Such a heat radiating plate for an electronic part mounting substrate more greatly shrinks than the electronic part mounting substrate to warp when it is bonded to the electronic part mounting substrate by soldering. For that reason, it is known that the heat radiating plate is previously caused to warp in the opposite direction (to have opposite warpage) before solder joint (see, e.g., Japanese Patent Laid-Open No. 2007-88045).

If the heat radiating plate is produced by press-forming by means of a progressive die, the opposite warpage of the heat radiating plate can be carried out by a series of plastic deformations during the correction of shape by means of a leveler and/or during the press-forming. However, a heat radiating plate having a high thermal conductivity of not less than 250 W/m·K is relatively soft (the Vickers hardness Hv thereof is not higher than 135). If the opposite warpage of such a soft heat radiating plate is carried out by a series of plastic deformations during the correction of shape by means of a leveler and/or during the press-forming, when a strip to be the material of the heat radiating plate is progressively fed (intermittently fed), the variation in residual stress is caused, so that it is difficult to stably cause the strip to warp.

SUMMARY OF THE INVENTION

It is therefore an object of the present invention to eliminate the aforementioned problems and to provide a heat radiating plate having a small variation in warpage when the plate is caused to warp, and a method for producing the same.

In order to accomplish the aforementioned and other objects, the inventors have diligently studied and found that it is possible to produce a heat radiating plate having a small variation in warpage when the plate is caused to warp, if the heat radiating plate is produced by a method comprising the steps of: finish cold-rolling an annealed material so that a ratio of the Vickers hardness HV after the finish cold-rolling to the Vickers hardness HV before the finish cold-rolling is not less than 1.2; causing a strip, which is obtained by the finish cold-rolling, to pass through a gap between rolls of a leveler to correct the shape of the strip; and progressively feeding the corrected strip to a progressive die via a feeder to progressively press-work the corrected strip to produce a heat radiating plate, wherein the corrected strip is allowed to bend due to its own weight between the leveler and the feeder so that the minimum value of deflection (L1−L0) is 0.5 to 2.0 m assuming that L0 is a distance between a roll at the last sending side of the leveler and a roll at the first entrance side of the feeder and that L1 is the length of the strip between the roll at the last sending side of the leveler and the roll at the first entrance side of the feeder. Thus, the inventors have made the present invention.

According to the present invention, there is provided a method for producing a heat radiating plate, the method comprising the steps of: finish cold-rolling an annealed material so that a ratio of the Vickers hardness HV after the finish cold-rolling to the Vickers hardness HV before the finish cold-rolling is not less than 1.2; causing a strip, which is obtained by the finish cold-rolling, to pass through a gap between rolls of a leveler to correct the shape of the strip; and progressively feeding the corrected strip to a progressive die via a feeder to progressively press-work the corrected strip to produce a heat radiating plate, wherein the corrected strip is allowed to bend due to its own weight between the leveler and the feeder so that the minimum value of deflection (L1−L0) is 0.5 to 2.0 m assuming that L0 is a distance between a roll at the last sending side of the leveler and a roll at the first entrance side of the feeder and that L1 is the length of the strip between the roll at the last sending side of the leveler and the roll at the first entrance side of the feeder.

In this method for producing a heat radiating plate, the minimum value of deflection (L1−L0) is preferably 0.7 to 1.2 m. The strip preferably has a thickness of 2 to 5 mm. The annealed material is preferably formed of copper or a copper alloy. The copper alloy preferably contains an additional element, the total amount of which is 1% by weight or less, and the balance being copper and unavoidable impurities. The additional element is preferably at least one element selected from the group consisting of Zn, Fe, Ni, Sn, P, Mg, Zr, Co, Cr, Si, Ti and Ag. The heat radiating plate may be caused to warp after the press-working. The heat radiating plate may be plated after the press-working.

According to the present invention, there is provided a heat radiating plate which has a thickness of 2 to 5 mm and which has surface layer portions on both sides thereof, the surface layer portions being softer than a central portion of the heat radiation plate so that a ratio (Hs/Hc) of an average hardness Hs (HV0.2) at a 1/12 position in thickness directions of the heat radiating plate to an average hardness He (HV0.2) at a 1/2 position in the thickness directions is not greater than 0.95.

The heat radiating plate is preferably formed of copper or a copper alloy. The copper alloy preferably contains an additional element, the total amount of which is 1% by weight or less, and the balance being copper and unavoidable impurities. The additional element is preferably at least one element selected from the group consisting of Zn, Fe, Ni, Sn, P, Mg, Zr, Co, Cr, Si, Ti and Ag. The heat radiating plate preferably has a thermal conductivity of not less than 280 W/m·K.

According to the present invention, it is possible to provide a heat radiating plate having a small variation in warpage when the plate is caused to warp, and a method for producing the same.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a method for producing a heat radiating plate according to the present invention will be described below in detail.

Figure 1:
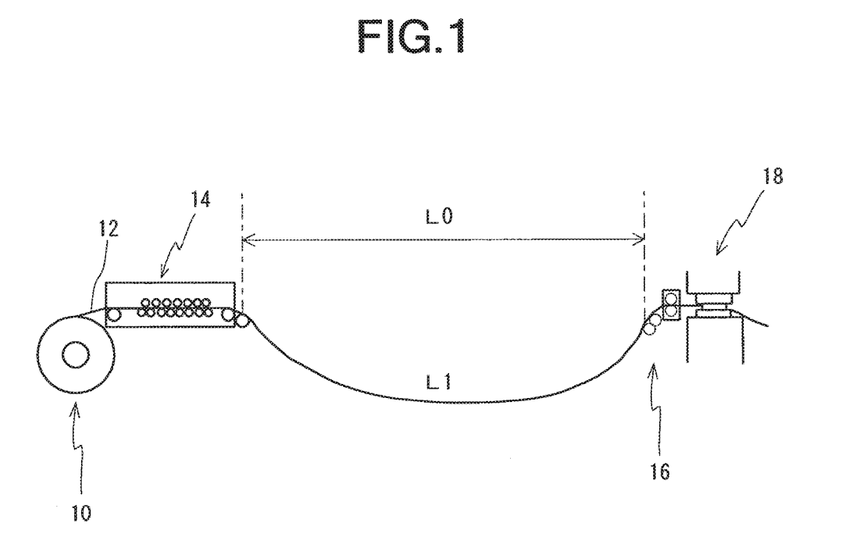
FIG. 1 is an illustration schematically showing an apparatus for producing a heat radiating plate by a method for producing a heat radiating plate according to the present invention.
Figure 2A:
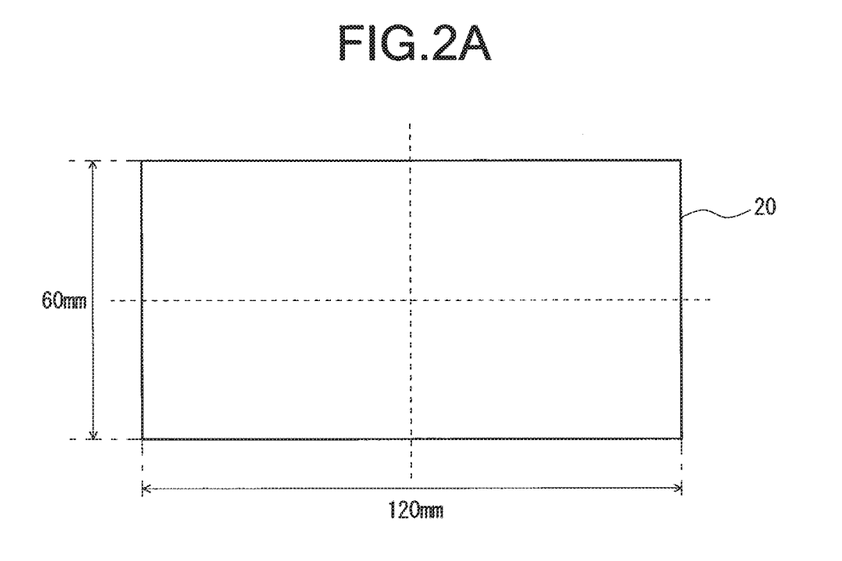
FIG. 2A is a plan view of a heat radiating plate produced in each of examples and comparative examples.
Figure 2B:
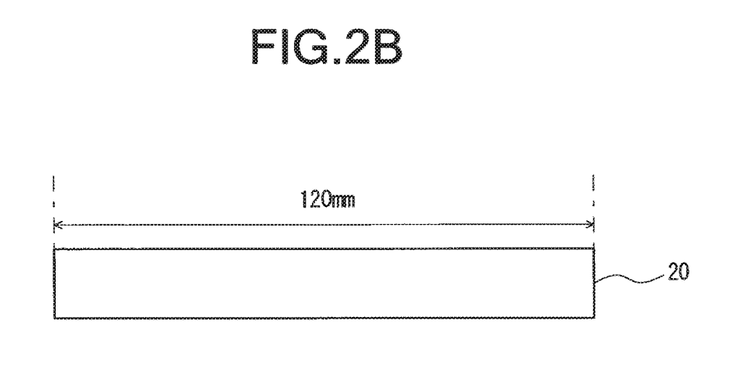
FIG. 2B is a side view of the heat radiating plate produced in each of examples and comparative examples.

In the preferred embodiment of a method for producing a heat radiating plate (or a heat sink plate) according to the present invention, a strip obtained by finish cold-rolling an annealed material is caused to wind in the shape of a coil to prepare a coil stock. As shown in FIG. 1, a strip 12 obtained by unwinding the coil stock by means of an uncoiler 10 is caused to pass through a gap between the rolls of a leveler 14 to correct the shape thereof. Then, the strip 12 is progressively fed (intermittently fed) to a progressive die 18 of a pressing machine via a feeder 16, to be progressively press-worked to produce a heat radiating plate 20 having a substantially rectangular planar shape as shown in FIGS. 2A and 2B.

The annealed material is generally produced by the steps of casting, hot-rolling, cold-rolling, annealing and so forth. The annealed material is preferably formed of copper or a copper alloy. The annealed material preferably has a thermal conductivity of not less than 280 W/m·K. The Vickers hardness HV of the surface of the annealed material is preferably 105 or less, and more preferably 100 or less. Such an annealed material can be obtained by heating a material of copper or a copper alloy for 5 to 10 hours, at a temperature in annealing furnace of 350 to 500° C. when the annealed material is formed of copper, and at a temperature in annealing furnace of 450 to 600° C. when the annealed material is formed of the copper alloy, respectively. When the annealed material is formed of the copper alloy, it preferably contains an additional element, the total amount of which is 1% by weight or less, and the balance being copper and unavoidable impurities. The additional element is preferably at least one element selected from the group consisting of Zn, Fe, Ni, Sn, P, Mg, Zr, Co, Cr, Si, Ti and Ag.

After the annealed material is finish cold-rolled, it is cut by slitting to obtain a strip. The finish cold-rolling is carried out so that a ratio of the Vickers hardness HV after the finish cold-rolling to the Vickers hardness HV before the finish cold-rolling is not less than 1.2 (preferably 1.3 to 1.7). Furthermore, the rolling reduction in the finish cold-rolling is preferably 40% or less, and more preferably 30% or less. Before the slitting after the finish cold-pressing, there may be carried out degreasing, pickling, polishing, low-temperature burning and so forth.

The surface of the strip 12 thus obtained preferably has a Vickers hardness HV of 135 or less. The strip 12 preferably has a thickness of 2 to 5 mm and a width of 50 to 250 mm.

The leveler 14 has a plurality of rolls (15 rolls in the shown preferred embodiment). These rolls are arranged so that the cross sections perpendicular to the longitudinal directions thereof are arranged in a staggered arrangement. The strip 12 is designed to pass through a gap between the upper and lower rolls of the leveler 14 to carry out levelling (the correction of the shape, such as peculiar bending). The gap between the upper and lower rolls is preferably adjusted so as to gradually increase toward the sending side so that a ratio of the gap between the rolls at the sending side to the gap between the rolls at the entrance side is 1.03 to 1.50. The gap is preferably adjusted so that the maximum gap between the rolls is 0.95 times or less as large as the thickness of the strip 12.

The feeder 16 has a plurality of rolls, and is designed to progressively feed the strip 12, which is progressively fed from the leveler 14, to a progressive die 18.

Assuming that L0 is the distance between the (lower) roll at the last sending side of the leveler 14 and the (lower) roll at the first entrance side of the feeder 16 and that L1 is the length of the strip 12 between these rolls (the length of a portion of the strip 12 which is not supported on the rolls), the strip 12 is allowed to bend due to its own weight between the leveler 14 and the feeder 16 so that the minimum value of deflection (L1−L0) is 0.5 to 2.0 m (preferably 0.6 to 1.5 m, and more preferably 0.7 to 1.5 m). The L0 is preferably 3 m or more. Furthermore, since the amount of deflection of the strip 12 varies when the strip 12 is progressively fed (intermittently fed) to the progressive die 18 by means of the feeder 16, the strip 12 is allowed to bend due to its own weight so that the minimum value of deflection is in the above-described range.

If the leveling of the strip 12 is thus carried out while using its own weight of the portion of deflection of the strip 12 as a tension, when the strip 12 is progressively fed (intermittently fed) to the progressive die 18 of the pressing machine to be progressively press-worked, the tension is not loosened, so that it is possible to maintain a stable internal stress state. Furthermore, the strip 12 (heat radiating plate 20) may be caused to warp during the levelling by means of the leveler 14 and during the press-working by means of the progressive die 18.

The strip 12 progressively fed (intermittently fed) to the progressive die 18 of the pressing machine from the feeder 16 is punched in the shape of the heat radiating plate 20 by progressive press-working. After the press-working, the surface of the heat radiating plate 20 may be plated with nickel.

By the above-described preferred embodiment of a method for producing a heat radiating plate, it is possible to produce a heat radiating plate which has a thickness of 2 to 5 mm and which has surface layer portions on both sides thereof, the surface layer portions being softer than a central portion of the heat radiation plate so that a ratio (Hs/Hc) of an average hardness Hs (HV0.2) at a 1/12 position in thickness directions of the heat radiation plate to an average hardness He (HV0.2) at a 1/2 position in the thickness directions is not greater than 0.95.

The heat radiating plate is preferably formed of copper or a copper alloy, and preferably has a thermal conductivity of not less than 280 W/m·K. When the heat radiating plate is formed of a copper alloy, it preferably contains an additional element, the total amount of which is 1% by weight or less, and the balance being copper and unavoidable impurities.

The additional element is preferably at least one element selected from the group consisting of Zn, Fe, Ni, Sn, P, Mg, Zr, Co, Cr, Si, Ti and Ag.

The heat radiating plate produced by the above described preferred embodiment of a method for producing a heat radiating plate has a small variation in warpage even if the plate is caused to warp, and the standard deviation of warpage thereof is a small value of 5 μm.

It is considered that the reason why the variation in warpage is thus decreased is that, if the surface layer portions on both sides of the heat radiating plate are caused to be softer than the central portion thereof, the spring deflection limit is deteriorated only in the vicinity of the surface thereof, to which the highest stress is applied during the deformation of the plate, to increase the plastic deformation in the vicinity of the surface. If the whole heat radiating plate is softened, the strength thereof is insufficient. For that reason, when such a soft heat radiating plate is caused to have opposite warpage, the variation in warpage thereof is not only increased, but there is also a case where the opposite warpage is insufficient when the heat radiating plate is bonded to an electronic part mounting substrate by soldering.

Furthermore, since the warpage of the heat radiating plate is slowly returned immediately after the press-working, the measurement of the amount of warpage is preferably carried out after about 300 hours from the press-working in order to decrease the variation in measured value.

Examples of a heat radiating plate and a method for producing the same according to the present invention will be described below in detail.

Example 1

After an annealed material (thermal conductivity=391 W/m·K, Vickers hardness HV=71) containing 99.6% by weight of Cu was finish cold-rolled at a finish rolling reduction of 14% and degreased with an alkaline degreasing solution containing potassium hydroxide and a surfactant, it was cut by slitting to prepare a coil-shaped rolled strip 12 having a thickness of 3 mm and a width of 140 mm (Vickers hardness HV=108, HV(a)/HV(b)=1.52 being a ratio of the Vickers hardness HV(a) after the finish cold-rolling to the Vickers hardness HV(b) before the finish cold-rolling). Furthermore, the Vickers hardness HV was measured by means of a Vickers hardness meter while applying a load of 5 kgf on the surface.

Figure 2C:
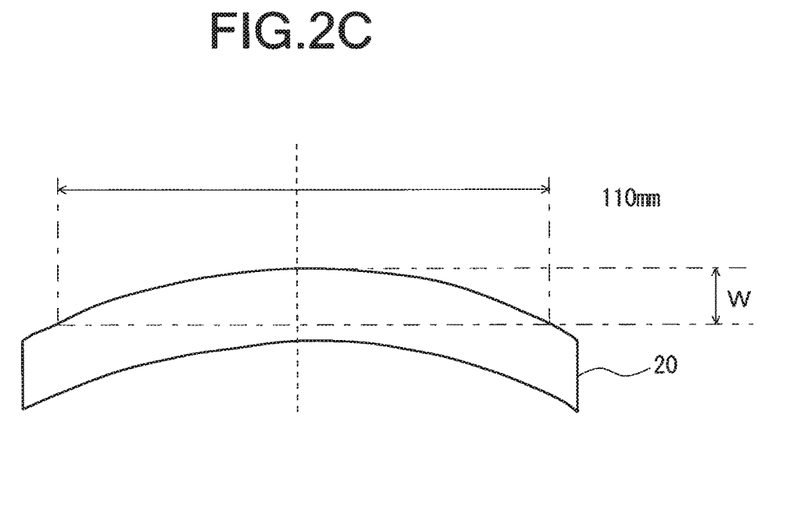
FIG. 2C is an illustration for explaining the amount of warpage of the heat radiating plate produced in each of examples and comparative examples.

Then, an apparatus shown in FIG. 1 (the total number of upper and lower rolls of the leveler 14 was 15 and the diameter of each of the rolls was about 30 mm in this example) was used. The gap between the rolls of the leveler 14 was set to be 0.70×thickness (=2.1 mm) at the entrance side and 0.85×thickness (=2.55 mm) at the sending side, respectively. The distance L0 between the roll at the last sending side of the leveler 14 and the roll at the first entrance side of the feeder 16 was set to be 5 m. While the strip 12 was allowed to bend due to its own weight between the leveler 14 and the feeder 16 so that the minimum value of deflection (L1−L0) (minimum deflection), which was a difference between L0 and the length L1 of the strip 12 between the roll at the last sending side of the leveler 14 and the roll at the first entrance side of the feeder 16, was 0.9 m, the strip 12 was progressively fed to the progressive die 18 to be punched in a substantially rectangular planar shape shown in FIGS. 2A and 2B, by progressive press-working (blanking in a substantially rectangular planar shape having a size of 120 mm×60 mm), and then, the punched strip was sequentially caused to warp in a shape shown in FIG. 2C by means of a warping tool. Thereafter, the warped strip was plated with nickel to form a nickel plating film having a thickness of 5 μm thereon to obtain 103 heat radiating plates 20. Furthermore, warping was carried out by adjusting the pushing amount of the warping tool so that the amount of warpage of the heat radiating plate was about 290 μm (the radius R of curvature in longitudinal directions of the heat radiating plate was about 5216 mm). The nickel plating was carried out as follows. After the plate caused to warp after being punched by press-working was dipped in an alkaline electrolytic degreasing solution to be electrolytic-degreased, it was dipped in sulfuric acid to be pickled. Thereafter, it was put in a sulphamic acid bath to carry out the electrodeposition nickel plating thereof, and then, it was hot-washed at a temperature of not higher than 90° C. for 15 minutes or less, and dried.

Three heat radiating plates thus obtained were used, and each of the three heat radiating plates was cut out in parallel to its rolling direction (the rolling direction of the rolled strip) and on a cross section perpendicular to the rolled surface thereof. The cross section was buffed, and then, finish electropolished to prepare three test pieces. A load of 200 gf was applied on each of the test pieces to measure the Vickers hardness (HV0.2) thereof by means of a micro Vickers hardness meter. Furthermore, the Vickers hardness was measured at 2 points (4 points in total) of each of 1/12 positions in thickness directions on both sides of the test piece (at 2 points of each of the t/12 position and 11t/12 position from one surface layer of the test piece assuming that the thickness (except for plating) of the test piece was t), and the average value of the measured values of the Vickers hardness (HV0.2) measured at the respective measuring positions with respect to three test pieces was obtained as Hs. In addition, the Vickers hardness was measured at 4 points of the 1/2 position in thickness directions of the test piece (at the 1/2 position from the surface layer of the test piece), and the average value of the measured values of the Vickers hardness (HV0.2) measured at the respective measuring positions with respect to the three test pieces was obtained as Hc. As a result, the average hardness Hs (HV0.2) at the 1/12 position in the thickness directions of the test piece was 94, and the average hardness Hc (HV0.2) at the 1/2 position in the thickness directions of the test piece was 110. The ratio (Hs/Hc) was 0.85, so that the surface layer portions on both sides of the test piece were softer than the central portion thereof.

Then, 100 heat radiating plates thus obtained were prepared, and a dial gauge was used for measuring the maximum value of rising height at a gauge length of 110 mm in a central portion, except for press undercut portions, on the convex surface of the heat radiating plate (the maximum value of a difference between heights in a portion having a length of 110 mm in a central portion on the convex surface of the heat radiating plate) as a warpage W. The measurement of the warpage was carried out after about 300 hours from the press-working. As a result, the standard deviation of the warpage was 3.55 μm.

Example 2

Heat radiating plates were obtained by the same method as that in Example 1, except that an annealed material (thermal conductivity=355 W/m·K, Vickers hardness HV=75) containing 0.02% by weight of Zn, 0.08% by weight of Fe, 0.01% by weight of Ni, 0.01% by weight of Sn and 0.02% by weight of P as additional elements (total content of additional elements=0.14% by weight) and containing the balance being Cu was finish cold-rolled at a finish rolling reduction of 21% to prepare a coil-shaped rolled strip having a thickness of 3 mm and a width of 140 mm (Vickers hardness HV=112.5, HV(a)/HV(b)=1.50) and that nickel plating was not carried out.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 104, He was 115, Hs/Hc was 0.90, and the surface layer portions on both sides of the test piece were softer than the central portion thereof. The standard deviation of the warpage was 3.02 μm.

Example 3

Heat radiating plates were obtained by the same method as that in Example 1, except that an annealed material (thermal conductivity=354 W/m·K, Vickers hardness HV=76) containing 0.11% by weight of Fe and 0.03% by weight of P as additional elements (total content of additional elements=0.14% by weight) and containing the balance being Cu was finish cold-rolled at a finish rolling reduction of 21% to prepare a coil-shaped rolled strip having a thickness of 3 mm and a width of 140 mm (Vickers hardness HV=113, HV(a)/HV(b)=1.49) and that the minimum deflection was 1.5 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 106, He was 116, Hs/Hc was 0.91, and the surface layer portions on both sides of the test piece were softer than the central portion thereof. The standard deviation of the warpage was 2.10 μm.

Example 4

Heat radiating plates were obtained by the same method as that in Example 1, except that an annealed material (thermal conductivity=340 W/m·K, Vickers hardness HV=72) containing 0.13% by weight of Sn, 0.11% by weight of Zn and 0.02% by weight of Ag as additional elements (total content of additional elements=0.26% by weight) and containing the balance being Cu was finish cold-rolled at a finish rolling reduction of 29% to prepare a coil-shaped rolled strip having a thickness of 3 mm and a width of 140 mm (Vickers hardness HV=116.6, HV(a)/HV(b)=1.62), that the minimum deflection was 1.3 m and that nickel plating was not carried out.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 112, He was 118, Hs/Hc was 0.95, and the surface layer portions on both sides of the test piece were softer than the central portion thereof. The standard deviation of the warpage was 3.97 μm.

Example 5

Heat radiating plates were obtained by the same method as that in Example 1, except that an annealed material (thermal conductivity=312 W/m·K, Vickers hardness HV=85) containing 0.60% by weight of Fe, 0.20% by weight of P, 0.05% by weight of Mg and 0.01% by weight of Co as additional elements (total content of additional elements=0.86% by weight) and containing the balance being Cu was finish cold-rolled at a finish rolling reduction of 22% to prepare a coil-shaped rolled strip having a thickness of 3 mm and a width of 140 mm (Vickers hardness HV=116, HV(a)/HV(b)=1.36), that the distance L0 was 3 m and that the minimum deflection was 0.6 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 111, He was 121, Hs/Hc was 0.92, and the surface layer portions on both sides of the test piece were softer than the central portion thereof. The standard deviation of the warpage was 3.98 μm.

Example 6

Heat radiating plates were obtained by the same method as that in Example 1, except that an annealed material (thermal conductivity=310 W/m·K, Vickers hardness HV=96) containing 0.10% by weight of Fe, 0.55% by weight of Cr, 0.06% by weight of Ti and 0.03% by weight of Si as additional elements (total content of additional elements=0.74% by weight) and containing the balance being Cu was finish cold-rolled at a finish rolling reduction of 25% to prepare a coil-shaped rolled strip having a thickness of 3 mm and a width of 140 mm (Vickers hardness HV=127, HV(a)/HV(b)=1.32), that the minimum deflection was 1.0 m and that nickel plating was not carried out.

With respect to heat radiating plates thus obtained, the average hardness Hs (HV0.2) at a 1/12 position in thickness directions of the test piece, the average hardness Hc (HV0.2) at a 1/2 position in the thickness directions of the test piece, the ratio (Hs/Hc) and the standard deviation of the warpage were obtained by the same methods as those in Example 1. As a result, Hs was 121, He was 130, Hs/Hc was 0.93, and the surface layer portions on both sides of the test piece were softer than the central portion thereof. The standard deviation of the warpage was 3.30 μm.

Example 7

Heat radiating plates were obtained by the same method as that in Example 1, except that an annealed material (thermal conductivity=302 W/m·K, Vickers hardness HV=78) containing 0.20% by weight of Fe, 0.14% by weight of Ni, 0.08% by weight of Sn and 0.06% by weight of P as additional elements (total content of additional elements=0.48% by weight) and containing the balance being Cu was finish cold-rolled at a finish rolling reduction of 25% to prepare a coil-shaped rolled strip having a thickness of 3 mm and a width of 140 mm (Vickers hardness HV=120, HV(a)/HV(b)=1.54) and that the minimum deflection was 1.0 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 110, He was 117, Hs/Hc was 0.94, and the surface layer portions on both sides of the test piece were softer than the central portion thereof. The standard deviation of the warpage was 3.24 μm.

Example 8

Heat radiating plates were obtained by the same method as that in Example 1, except that an annealed material (thermal conductivity=354 W/m·K, Vickers hardness HV=73) containing 0.11% by weight of Fe and 0.03% by weight of P as additional elements (total content of additional elements=0.14% by weight) and containing the balance being Cu was finish cold-rolled at a finish rolling reduction of 25% to prepare a coil-shaped rolled strip having a thickness of 2 mm and a width of 140 mm (Vickers hardness HV=117, HV(a)/HV(b)=1.60), that the distance L0 was 4 m and that the minimum deflection was 1.0 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 106, He was 115, Hs/Hc was 0.92, and the surface layer portions on both sides of the test piece were softer than the central portion thereof. The standard deviation of the warpage was 3.66 μm.

Example 9

Heat radiating plates were obtained by the same method as that in Example 1, except that an annealed material (thermal conductivity=354 W/m·K, Vickers hardness HV=77) containing 0.11% by weight of Fe and 0.03% by weight of P as additional elements (total content of additional elements=0.11% by weight) and containing the balance being Cu was finish cold-rolled at a finish rolling reduction of 14% to prepare a coil-shaped rolled strip having a thickness of 4 mm and a width of 140 mm (Vickers hardness HV=112.4, HV(a)/HV(b)=1.46), that the distance L0 was 5.5 m and that the minimum deflection was 0.9 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 99, He was 113, Hs/Hc was 0.88, and the surface layer portions on both sides of the test piece were softer than the central portion thereof. The standard deviation of the warpage was 3.06 μm.

Example 10

Heat radiating plates were obtained by the same method as that in Example 1, except that an annealed material (thermal conductivity=354 W/m·K, Vickers hardness HV=80) containing 0.11% by weight of Fe and 0.03% by weight of P as additional elements (total content of additional elements=0.14% by weight) and containing the balance being Cu was finish cold-rolled at a finish rolling reduction of 9% to prepare a coil-shaped rolled strip having a thickness of 5 mm and a width of 140 mm (Vickers hardness HV=106, HV(a)/HV(b)=1.33), that the distance L0 was 6 m and that the minimum deflection was 0.9 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 102, He was 115, Hs/Hc was 0.89, and the surface layer portions on both sides of the test piece were softer than the central portion thereof. The standard deviation of the warpage was 3.96 μm.

Comparative Example 1

Heat radiating plates were obtained by the same method as that in Example 1, except that the distance L0 was 0.5 m and that the minimum deflection was 0 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 114, He was 112, Hs/Hc was 1.02, and the surface layer portions on both sides of the test piece were slightly harder than the central portion thereof. The standard deviation of the warpage was 9.89 μm.

Comparative Example 2

Heat radiating plates were obtained by the same method as that in Example 2, except that the distance L0 was 0.5 m and that the minimum deflection was 0 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 119, He was 116, Hs/Hc was 1.03, and the surface layer portions on both sides of the test piece were slightly harder than the central portion thereof. The standard deviation of the warpage was 9.78 μm.

Comparative Example 3

Heat radiating plates were obtained by the same method as that in Example 3, except that the distance L0 was 1 m and that the minimum deflection was 0.2 m.

With respect to heat radiating plates thus obtained, the average hardness Hs (HV0.2) at a 1/12 position in thickness directions of the test piece, the average hardness Hc (HV0.2) at a 1/2 position in the thickness directions of the test piece, the ratio (Hs/Hc) and the standard deviation of the warpage were obtained by the same methods as those in Example 1. As a result, Hs was 113, He was 115, Hs/Hc was 0.98, and the surface layer portions on both sides of the test piece were slightly softer than the central portion thereof. The standard deviation of the warpage was 8.54 μm.

Comparative Example 4

Heat radiating plates were obtained by the same method as that in Example 5, except that the distance L0 was 2 m and that the minimum deflection was 0.3 m.

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 120, Hc was 121, Hs/Hc was 0.99, and the surface layer portions on both sides of the test piece were slightly softer than the central portion thereof. The standard deviation of the warpage was 6.86 μm.

Comparative Example 5

Heat radiating plates were attempted to be produced by the same method as that in Example 8, except that the distance L0 was 5 m, that the minimum deflection was 2.5 m and that nickel plating was not carried out. However, rubbing with pilot pins in the die was great, so that it was not possible to produce any heat radiating plate.

Comparative Example 6

Heat radiating plates were obtained by the same method as that in Example 1, except that an annealed material (thermal conductivity=355 W/m·K, Vickers hardness HV=108) containing 0.02% by weight of Zn, 0.08% by weight of Fe, 0.01% by weight of Ni, 0.01% by weight of Sn and 0.02% by weight of P as additional elements (total content of additional elements=0.14% by weight) and containing the balance being Cu was finish cold-rolled at a finish rolling reduction of 21% to prepare a coil-shaped rolled strip having a thickness of 3 mm and a width of 140 mm (Vickers hardness HV=127, HV(a)/HV(b)=1.18).

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 126, He was 128, Hs/Hc was 0.98, and the surface layer portions on both sides of the test piece were softer than the central portion thereof. The standard deviation of the warpage was 8.80 μm.

Comparative Example 7

Heat radiating plates were obtained by the same method as that in Example 1, except that an annealed material (thermal conductivity=354 W/m·K, Vickers hardness HV=76) containing 0.11% by weight of Fe and 0.03% by weight of P as additional elements (total content of additional elements=0.14% by weight) and containing the balance being Cu was finish cold-rolled at a finish rolling reduction of 6% to prepare a coil-shaped rolled strip having a thickness of 3 mm and a width of 140 mm (Vickers hardness HV=90.4, HV(a)/HV(b)=1.19).

With respect to heat radiating plates thus obtained, the average hardness Hs (HV0.2) at a 1/12 position in thickness directions of the test piece, the average hardness He (HV0.2) at a 1/2 position in the thickness directions of the test piece, the ratio (Hs/Hc) and the standard deviation of the warpage were obtained by the same methods as those in Example 1. As a result, Hs was 89, He was 91, Hs/Hc was 0.98, and the surface layer portions on both sides of the test piece were softer than the central portion thereof. The standard deviation of the warpage was 6.77 μm.

The producing conditions and characteristics of the heat radiating plates in these examples and comparative examples are shown in Tables 1 through 3.

TABLE 1

| | Chemical Composition (% by weight) | | | | | | | Total of Additional Elements | Thermal Conductivity (W/m · K) |
|---|---|---|---|---|---|---|---|---|---|
| | Zn | Fe | Ni | Sn | P | Others | Cu | | |
| Ex. 1 Comp. 1 | — | — | — | — | — | | >99.6 | 0 | 391 |
| Ex. 2 Comp. 2, 6 | 0.02 | 0.08 | 0.01 | 0.01 | 0.02 | | bal. | 0.14 | 355 |
| Ex. 3 Ex. 8-10 Comp. 3, 5, 7 | | 0.11 | | | 0.03 | | bal. | 0.14 | 354 |
| Ex. 4 | | | | 0.13 | | Zr = 0.11 Ag = 0.02 | bal. | 0.26 | 340 |
| Ex. 5 Comp. 4 | 0.60 | | | | 0.20 | Mg = 0.05 Co = 0.01 | bal. | 0.86 | 312 |
| Ex. 6 | | 0.10 | | | | Cr = 0.55 Ti = 0.06 Si = 0.03 | bal. | 0.74 | 310 |
| Ex. 7 | 0.20 | 0.14 | 0.08 | 0.06 | | | bal. | 0.48 | 302 |

TABLE 2

| | HV(b) | Finish Rolling Reduction (%) | HV(b)/HV(a) | Thickness (mm) |
|---|---|---|---|---|
| Ex. 1 | 71 | 14 | 1.52 | 3 |
| Ex. 2 | 75 | 21 | 1.50 | 3 |
| Ex. 3 | 76 | 21 | 1.49 | 3 |
| Ex. 4 | 72 | 29 | 1.62 | 3 |
| Ex. 5 | 85 | 22 | 1.36 | 3 |
| Ex. 6 | 96 | 25 | 1.32 | 3 |
| Ex. 7 | 78 | 25 | 1.54 | 3 |
| Ex. 8 | 73 | 25 | 1.60 | 2 |
| Ex. 9 | 77 | 14 | 1.46 | 4 |
| Ex. 10 | 80 | 9 | 1.33 | 5 |
| Comp. 1 | 71 | 14 | 1.52 | 3 |
| Comp. 2 | 75 | 21 | 1.50 | 3 |
| Comp. 3 | 76 | 21 | 1.49 | 3 |
| Comp. 4 | 85 | 22 | 1.36 | 3 |
| Comp. 5 | 73 | 25 | 1.60 | 2 |
| Comp. 6 | 108 | 21 | 1.18 | 3 |
| Comp. 7 | 76 | 6 | 1.19 | 3 |

TABLE 3

| | Minimum Deflection (m) | L0 (m) | Presence of Ni Plating after Pressing | Hs | Hc | Hs/Hc | Standard Deviation of Warpage (μm) |
|---|---|---|---|---|---|---|---|
| Ex. 1 | 0.9 | 5 | Yes | 94 | 110 | 0.85 | 3.55 |
| Ex. 2 | 0.9 | 5 | No | 104 | 115 | 0.90 | 3.02 |
| Ex. 3 | 1.5 | 5 | Yes | 106 | 116 | 0.91 | 2.10 |
| Ex. 4 | 1.3 | 5 | No | 112 | 118 | 0.95 | 3.97 |
| Ex. 5 | 0.6 | 3 | Yes | 111 | 121 | 0.92 | 3.98 |
| Ex. 6 | 1.0 | 5 | No | 121 | 130 | 0.93 | 3.30 |
| Ex. 7 | 1.0 | 5 | Yes | 110 | 117 | 0.94 | 3.24 |
| Ex. 8 | 1.0 | 4 | Yes | 106 | 115 | 0.92 | 3.66 |
| Ex. 9 | 0.9 | 5.5 | Yes | 99 | 113 | 0.88 | 3.06 |
| Ex. 10 | 0.9 | 6 | Yes | 102 | 115 | 0.89 | 3.96 |
| Comp. 1 | 0.0 | 0.5 | Yes | 114 | 112 | 1.02 | 9.89 |
| Comp. 2 | 0.0 | 0.5 | No | 119 | 116 | 1.03 | 9.78 |
| Comp. 3 | 0.2 | 1 | Yes | 113 | 115 | 0.98 | 8.54 |
| Comp. 4 | 0.3 | 2 | Yes | 120 | 121 | 0.99 | 6.86 |
| Comp. 5 | 2.5 | 5 | No | — | — | — | — |
| Comp. 6 | 0.9 | 5 | Yes | 126 | 128 | 0.98 | 8.80 |
| Comp. 7 | 0.9 | 5 | Yes | 89 | 91 | 0.98 | 6.77 |

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A heat radiating plate which has a thickness of 2 to 5 mm and which has surface layer portions on both sides thereof, the surface layer portions being softer than a central portion of the heat radiation plate so that a ratio (Hs/Hc) of an average hardness Hs (HV0.2) at a 1/12 position in thickness directions of the heat radiation plate to an average hardness Hc (HV0.2) at a 1/2 position in the thickness directions is not greater than 0.95.

2. A heat radiating plate as set forth in claim 1, wherein said heat radiating plate is formed of copper or a copper alloy.

3. A heat radiating plate as set forth in claim 2, wherein said copper alloy contains an additional element, the total amount of which is 1% by weight or less, and the balance being copper and unavoidable impurities.

4. A heat radiating plate as set forth in claim 3, wherein said additional element is at least one element selected from the group consisting of Zn, Fe, Ni, Sn, P, Mg, Zr, Co, Cr, Si, Ti and Ag.

5. A heat radiating plate as set forth in claim 2, wherein said heat radiating plate has a thermal conductivity of not less than 280 W/m·K.

* * * * *